(12) United States Patent
Goto et al.

(10) Patent No.: US 6,210,787 B1
(45) Date of Patent: Apr. 3, 2001

(54) TRANSPARENT ELECTROMAGNETIC WAVE SHIELD

(75) Inventors: Hideki Goto; Junji Tanaka, both of Tokyo (JP)

(73) Assignee: Sumitomo Bakelite Company Limited, Tokyo (JP)

( * ) Notice: Subject to any disclaimer, the term of this patent is extended or adjusted under 35 U.S.C. 154(b) by 0 days.

(21) Appl. No.: 09/326,661

(22) Filed: Jun. 7, 1999

(30) Foreign Application Priority Data

| Aug. 10, 1998 | (JP) | 10-225826 |
| Aug. 10, 1998 | (JP) | 10-225827 |
| Aug. 10, 1998 | (JP) | 10-225828 |
| Aug. 10, 1998 | (JP) | 10-225829 |
| Aug. 10, 1998 | (JP) | 10-225830 |
| Aug. 10, 1998 | (JP) | 10-225831 |
| Sep. 30, 1998 | (JP) | 10-276264 |

(51) Int. Cl.$^7$ .................................. B32B 27/04
(52) U.S. Cl. ................ 428/301.4; 428/300.7; 428/399; 428/400; 428/401; 428/930; 428/923; 428/195
(58) Field of Search ............................ 428/287, 296, 428/300.7, 340, 399, 408, 922, 301.07, 400, 401, 923, 930; 156/178, 148, 308.2

(56) References Cited

U.S. PATENT DOCUMENTS

| 4,514,585 | * | 4/1985 | Paynton | 174/35 GC |
| 4,965,408 | * | 10/1990 | Chapman et al. | 174/35 MS |
| 4,983,452 | * | 1/1991 | Daimon et al. | 428/287 |

FOREIGN PATENT DOCUMENTS

| 0297231 | 1/1989 | (EP) . |
| 0369639 | 5/1990 | (EP) . |
| 0446038A2 | 9/1991 | (EP) . |
| 0917174A2 | * 5/1999 | (EP) . |

OTHER PUBLICATIONS

Patent abstracts of Japan, vol. 1998, No. 04, Mar. 31, 1998, Japan 09 330667.

Patent abstracts of Japan, vol. 1998, No. 11, Sep. 30, 1998, Japan 10173391.

Patent abstracts of Japan, vol. 1998, No. 08, Jun. 30, 1998, Japan 10075087.

* cited by examiner

*Primary Examiner*—Merrick Dixon
(74) *Attorney, Agent, or Firm*—Smith, Gambrell & Russell, LLP (57) ABSTRACT

A transparent electromagnetic wave shield comprising a transparent polymer film and a conductive layer of a linear pattern shape formed on at least one side of said film, wherein the line intervals in said linear pattern are random between 20 $\mu$m and 1 mm.

18 Claims, 4 Drawing Sheets

TRANSPARENT ELECTROMAGNETIC WAVE SHIELD

FIELD OF THE INVENTION

The present invention relates to surface covering for the screens of display devices, especially plasma displays (hereinafter abbreviated as PDP) which need to be guarded against leakage of electromagnetic waves, and for other transparent structures which are required to be capable of being seen through, for example, windows of a room where medical instruments are installed.

With rapid progress of electronics and consequential prevalence of computers and other electronic devices in recent years, concern is growing over disturbance caused by electromagnetic waves which would generate erroneous operation of electronic devices. One means for preventing such electromagnetic wave disturbance is active shielding capable of confining the unnecessary electromagnetic waves at the source of generation, which can be realized, for instance, by designing the housing of the electronic device to be electroconductive. Various materials such as metal foil, punched metal foil, metal mesh, metal fiber, plated organic or inorganic fiber, etc., have been used or tried for preventing leakage of electromagnetic waves, but transparency is an absolute requirement for the displays such as PDP and see-through windows, and any of said materials was unsuited for use from the aspect of light permeability.

Further, since oxidation proceeds on the metal surface with the lapse of time, even metal mesh which, among said materials, is considered to be best suited for meeting the transparency requirement, has the problem that high frequency contact tends to break at the lattice points, making it difficult to maintain a stable electromagnetic wave shielding effect for a long time. It has also been conceived to use a composite oxide of indium oxide and tin oxide (hereinafter referred to as ITO) which is proof against oxidative degradation and widely used as electrode for liquid crystal displays, but it is reported that this composite oxide is not so effective in preventing leakage of electromagnetic waves, and its application has been limited to uses relating to destaticization means. It has been attempted to elevate conductivity of this material to the same level (1 Ω/□ or less) as metal, but actually the highest conductivity that could be obtained with this material was 4 Ω/□ even when a film thereof was formed on a glass substrate under heating, and it has been technically impossible to deposit ITO on a plastic film.

There also exists weight problem. Use of glass substrates which have a large size, such as 40 to 50 inches or greater in diagonal—which is the size expected to become most popular and to be applied to PDP—and accordingly are heavy in weight, posed the problem from the aspect of installability, too. On the other hand, in case of using a plastic substrate for weight reduction, from the point of heat resistance it becomes impossible to apply substrate heating, which is the most important means for enhancing transparency and conductivity, which makes it unable to realize low resistance. Further, when it is tried to reduce resistance by increasing film thickness, problem would arise on liability to exfoliation or cracking by buildup of internal stress in the film, due to the difference in linear expansion coefficient between the ITO film and plastic substrate. Thus, 20 to 40Ω was the limit that could be achieved in the attempts for forming an ITO film with low resistance of the same level as metal, and it was hardly possible to attain the object.

OBJECT OF THE INVENTION

An object of the present invention is to provide inexpensively an electromagnetic wave shielding transparent film having high transparency as well as excellent electromagnetic wave shielding effect, which is best suited for application to displays, especially plasma displays, and windows of a medical instrument room.

SUMMARY OF THE INVENTION

In the first embodiment of the present invention, there is provided a transparent electromagnetic wave shield comprising a transparent polymer film and a linear-patterned conductive layer formed on at least one side of said polymer film, wherein the line intervals in the linear pattern are random between 20 μm and 1 mm.

In a preferred mode of practice, the linear pattern of the conductive layer is of a lattice form consisting of the straight lines arranged both longitudinally and laterally, or a form made by longitudinal and lateral arrangement of the curves defined by the Sin function, Tan function, exponential function, logarithmic function or inversely proportional function expressed by each of the following formulae (1) to (6), or a form consisting of a combined arrangement of these straight lines and curves.

$$y = A \cdot \sin(\alpha x + \phi) \tag{1}$$

$$y = B \cdot \tan(\beta x + \psi) \tag{2}$$

(A, B, α, β, φ, ψ: arbitrary constants)

$$y = C \cdot \exp(\gamma x + \rho) \tag{3}$$

$$y = D \cdot \ln(\delta x + \xi) \tag{4}$$

(C, D, γ, δ, ρ, ξ: arbitrary constants)

$$y = E/x \tag{5}$$

(E: arbitrary constant)

In a more preferred mode of practice, the ratio of the line width P (μm) of the linear pattern to the thickness D (μm) of the conductive layer (P/D ratio) falls within the range of 1 to 540, preferably 2 to 240.

The second embodiment of the present invention is a transparent electromagnetic wave shield comprising a transparent polymer film and, formed on at least one side thereof, an adhesive layer optionally, a transparent metal oxide film and a thin metal layer successively in this order, wherein the thin metal layer alone is selectively etched to form a linear pattern, and the line intervals in the linear pattern are random between 20 μm and 1 mm. Preferably, the thin metal layer is composed of copper.

The third embodiment of the present invention is a transparent electromagnetic wave shield comprising a transparent polymer film and, laminated successively on at least one side thereof, an adhesive layer containing a near infrared screening material and a colorant for making color compensation, and a conductive layer, said conductive layer being worked into a linear pattern, wherein the line intervals in said linear pattern are random between 20 μm and 1 mm.

The fourth embodiment of the present invention provides a transparent electromagnetic wave shield comprising a transparent polymer film and, laminated successively on at least one side thereof, an adhesive layer 1 and a conductive layer, said conductive layer being worked into a linear pattern so that the line intervals in the pattern become random between 20 μm and 1 mm, the thus worked laminated film being further bonded to a transparent polymer reinforcement by an adhesive layer 2, wherein a near infrared screening material and a colorant for making color compensation for said infrared screening material are contained in at least one of said adhesive layer 1 and adhesive layer 2, and there is further provided at least one ultraviolet screening layer for preventing deterioration of the near infrared screening material.

In the transparent electromagnetic wave shield according to the third or fourth embodiment, preferably at least one layer of water vapor barrier is further provided.

The fifth embodiment of the present invention is a transparent electromagnetic wave shield comprising a transparent polymer film and, successively laminated on at least one side thereof, an adhesive layer 1 and a conductive layer, said conductive layer being worked into a linear pattern where the line intervals are random between 20 $\mu$m and 1 mm, the thus worked laminated film being further bonded to a transparent polymer reinforcement by an adhesive layer 2, wherein a near infrared screening material and a colorant for making color compensation for said infrared screening material are contained separately in the adhesive layer 1 and the adhesive layer 2, respectively, or contained in the adhesive layer 2 alone.

In the transparent electromagnetic wave shields according to the first to fifth embodiments of the present invention, preferably the light permeability at wavelength of 550 nm is 50% or above, the laminated film is laminated to a transparent polymer reinforcement having a thickness of 1 mm or greater through the medium of an adhesive layer, and an antireflection layer and/or a hard coat are provided on at least one of said laminated film and transparent polymer reinforcement.

DETAILED DESCRIPTION OF THE INVENTION

The polymer film constituting the base of the conductive layer, which is the highlight of the present invention, may be made of polyesters such as polyethylene terephthalate, polybutylene terephthalate and polyethylene naphthalate, thermoplastic resins such as polyimides, polycarbonates, polyacrylonitrile, polyethersulfone, polysulfone, polyetherimides, polyallylates and polynorbornenes, ultraviolet-curing resins, and thermosetting resins represented by epoxy resins. It is preferred to use a film having transparency of 80% or above in terms of light permeability at 550 nm (the values of light permeability shown hereinafter are all those determined at wavelength of 550 nm). Copolymers of the above polymers are also usable as film material.

The total light permeability is preferably as high as possible, but as it is desirable that such light permeability is 50% or higher in the final product, it suffices for the purpose if the substrate has light permeability of 80% even when at least 2 layers are laminated. The higher the permeability is, a greater number of layers can be laminated, so that the substrate permeability is more preferably 85% or above, most preferably 90% or above, and it is also effective means therefor to reduce the thickness. For example, the thickness of the polymer film is preferably selected to fall within the range of 25 to 300 $\mu$m in view of workability, although it is not specifically restricted as far as the desired transparency is provided. When its thickness is less than 25 $\mu$m, the film proves to be too pliant and becomes liable to stretch or wrinkle due to tension produced in the conductive layer laminating step. On the other hand, when the polymer film thickness exceeds 300 $\mu$m, the film is reduced in its flexibility, making it difficult to conduct continuous take-up operation in each step. Particularly in case a plural number of layers are laminated, large thickness greatly deteriorates workability, so that considering working efficiency and overall thickness, the most preferred film thickness is 25 to 100 $\mu$m.

In laminating the conductive layer, it is possible to provide a known adhesive layer for the purpose of enhancing adhesive force. This becomes an important factor especially when the conductive layer is patterned into fine linear configuration. For example, when pattern is formed by etching, the adhesive force between the base and the conductive layer needs to be at least about 0.3 kg/cm for enduring water pressure of shower. An adhesive force of 1.0 kg/cm or greater is required to keep no problem in practical use. Unless this level of adhesive force is provided, there may take place exfoliation of the conductive layer after pattern formation or disconnection during etching work. Further, as the final product is required to have a high light permeability, thickness of the adhesive layer and refractive exponential of the material used therefor become the important factors. The type of the adhesive material may be properly selected according to the base used. In case of using a resin for the adhesive layer, it is possible to use, for instance, synthetic resins such as urea resins, melamine resins, phenol resins, epoxy resins, vinyl acetate resins, cyanoacrylate resins, polyurethane resins, $\alpha$-olefin-maleic anhydride resins, aqueous polymer-isocyanate resins, acrylic resins, and UV curing resins. It is also possible to use emulsion adhesives, hot melt adhesives, synthetic rubber adhesives, silicone adhesives, and inorganic adhesives.

The conductive layer formed on said film may be made of metals such as Au, Ag, Al, Pt and Cu, their alloys, oxides or nitrides of these metals, ITO, conductive polymers, and other materials capable of desired patterning. Such plural conductive layers may be laminated on the base film if so required. In case of using a metal, the layer thickness is preferably in the range from 50 Å to 50 $\mu$m. When the layer thickness is less than 50 Å, desired shielding effect may not be obtained, and when it exceeds 50 $\mu$m, pattern workability deteriorates and light permeability of the layer decreases. Lamination of the conductive layer can be effected by such a method as vapor deposition, sputtering, ion plating, electroplating, metal foil laminating, or a combination of these methods. Sputtering is usually used for film forming of ITO-containing oxides or nitrides, but sol/gel method can also be employed. In case the conductive layer is formed by vapor deposition or electroplating, the pattern can be formed by photolithography, and in case the layer is formed by coating, the pattern can be formed by printing. When the conductive layer thickness is less than 1 $\mu$m, fine line working is facilitated, which contributes to the improvement of light permeability in pattern designing. When the conductive layer thickness is not less than 1 $\mu$m, shielding effect can be enhanced because of reduced surface resistance. Film forming method can be determined depending on conductivity of the material used, conductive layer thickness, aperture proportion and shape of the pattern. A method is selected which is suited for obtaining the desired film thickness by giving consideration to the properties of the base used and economy.

In forming a pattern in the conductive layer, its configuration is a crucial factor. In case, for instance, the lattice pixels are formed on an object to which the transparent electromagnetic wave shield is installed, like on a PDP screen, moire is generated to badly deteriorate recognizability of the picture on the screen when the PDP pixels and the lattice pattern of the transparent electromagnetic wave shield are superposed. The present inventors found that such a moire phenomenon can be prevented by selecting the line intervals to be Pi (i=0, 1, 2, ... n) of the following equation (A) in lattice pattern working of the conductive layer formed on at least one side of the transparent polymer film.

$$Pi = P\min + (P\max - P\min) \cdot \alpha i \tag{A}$$

i=0, 1, 2, ... n

Pmin: minimum value of line interval

Pmax: maximum value of line interval $\alpha i$: random number selected between 0 and 1

It is known that a moire fringe appears as the lines of equal pitch overlap each other when they are superposed. One cause of generation of such moire fringe is attributed to the fact that when the lines are superposed, the coarse portions and the dense portions are generated continuously, and there are formed the new lattices observed as a continuum of the dense portions. In order to design the pattern configuration so that the dense portions won't be arranged regularly, the line intervals are made irregular within the range that satisfies both requirements of shielding performance and optical effect. More specifically, design is made to satisfy the equation (A) using random numbers. The minimum and maximum values of line interval may be optionally decided according to the shape of the lattice provided at the associated electromagnetic wave generation source. In the case of displays such as PDP, the line intervals of 20 $\mu$m to 1 mm are sufficient, but usually a better result is obtained when they are 70 to 500 $\mu$m, especially 80 to 200 $\mu$m. This line interval is defined as center distance of the lines which adjoin each other when arbitrary one-dimensional coordinate axes are taken on the pattern. The lines forming the pattern are an array of straight lines, curves or a combination thereof.

It was found that the problem of moire phenomenon can be overcome by arranging the straight lines and/or curves for the pattern of the conductive layer formed on at least one side of a transparent polymer film, and in the case of curves, by forming a pattern where the Sin, Tan, exponential, logarithmic, inversely proportional function or a combination thereof is arranged longitudinally and laterally. Moire phenomenon is generated by overlapping of the periodical strength distribution of light produced by the partition walls forming the PDP pixels and the similar strength distribution produced by the conductive layer pattern. Therefore, moire fringe tends to take place when the pixels composing PDP resemble the shape of the conductive layer pattern. In case a certain specific Sin, Tan, exponential, logarithmic or inversely proportional function or a combination thereof is applied to the conductive layer pattern design as in the present invention, although a light strength distribution is generated by superposition of the PDP partition walls and the conductive layer pattern, such distribution can be lessened and uniformalized to such an extent that it can not be recognized with the eye, so that it is possible to inhibit generation of moire phenomenon while maintaining aperture proportion for providing sufficient transparency and electromagnetic wave shielding effect. Here, since moire fringe is formed depending on the configuration produced when the PDP pixels are superposed on the electromagnetic wave shield pattern, the period and amplitude of the functions composing the shield pattern are determined by taking into account the pitch and line width of the PDP pixels. Also, the pitch and line width used for arranging these functions are optionally decided within the range that can provide both of the desired electromagnetic wave shielding effect and aperture proportion.

Pattern working of the conductive layer is a crucial factor in determining the shield performance. Shield performance is associated with surface resistance and mesh density of the conductive layer, and it is necessary for obtaining the desired shield performance to design the pattern by giving consideration to these matters. Mesh density is decided by line width of the conductive layer and spacing between the lines, while surface resistance of the conductive layer is decided by specific resistance of the conductive material and thickness of the conductive layer.

It was found that the condition for satisfying both of these factors (i.e. mesh density and surface resistance) is that the P/D ratio falls preferably in the range of 1 to 540, more preferably 2 to 240 (P: line width ($\mu$m) of the metal film filter pattern; D: thickness ($\mu$m) of the metal film). Within this range, it is possible to satisfy both requirements for shield performance and transparency while maintaining the conductive layer surface resistance at the desired level. In relation to the substantial conductive layer thickness, there arises the problem that if the P/D ratio is less than 1, no satisfactory shield effect can be obtained, while when the ratio exceeds 540, transparency decreases excessively.

In case a shield is formed by laminating a copper layer on a transparent polymer film, there is the problem that no satisfactory adhesion can be obtained. This is considered attributable to wide difference in physical constants such as linear expansion coefficient and modulus of elasticity of the base, adhesive layer and copper layer. Difficulty in selecting a proper adhesive that can satisfy both transparency and adhesion requirements is also a large negative factor. This problem is prominent particularly when copper is laminated by such a method as vapor deposition or sputtering, in which case it is hard to obtain satisfactory adhesion. Insufficient adhesion between copper layer and base makes it difficult to increase productivity, resulting in elevated cost of the products.

In order to solve the above problem, the present invention proposes use of a transparent metal oxide as the adhesive layer material, which makes it possible to satisfy both transparency and adhesion requirements and to realize a high-reliability transparent electromagnetic wave shield. The above matter is important especially when the conductive layer is worked into a fine linear pattern. For instance, when the pattern is formed by etching, the adhesive force between base and conductive layer needs to be not less than about 0.3 kg/cm for enduring shower water pressure. The practically recommended safe level of adhesive force is 1.0 kg/cm or above. If no such adhesive force is provided, there may take place exfoliation of the conductive layer after pattern formation or disconnection during etching work. Thickness of the adhesive layer and refractive exponential of the material used for the adhesive layer are also the important factors where a higher light permeability is desired.

The transparent metal oxide film may be made of $In_2O_3$, a conductive composite oxide such as $In_2O_3$ and $SnO_2$ (ITO), $In_2O_3$ and ZnO, and $In_2O_3$ and $Ga_2O_3$; SiOx, TiOx, and a composite oxide thereof. The transparent oxide film can be formed by vacuum deposition methods such as sputtering, vapor deposition and ionic plating, coating method according to sol/gel process, and other methods. A suitable method is selected by taking into account the type of the film to be formed, film thickness, productivity and other factors. Vacuum deposition allows formation of a conductive film with low resistance, so that shield effect is expected to improve. In case of using the coating method, an anchor effect for the copper layer is provided by the fine unevenness of the surface layer, so that this method is advantageous for enhancing adhesion. Before forming the transparent metal oxide film, it is possible to conduct the normally employed pretreatments such as under coating, priming, corona discharge treatment, etc., for obtaining higher adhesion to the base.

Then a copper layer is formed on the transparent metal oxide film. Copper layer lamination on the transparent metal oxide film causes migration between the copper layer and the oxide film to form an intermediate layer made of cuprous oxide between the two layers. This intermediate layer has a gradient structure in which the composition of both components changes little by little in the thickness direction, so that higher adhesion is obtained than when an intermediate layer of cuprous oxide is simply provided. When oxidation advances from cuprous oxide to cupric oxide, causing an increase of thickness of the copper oxide layer, adhesion is now lowered, so that the composition and thickness of the intermediate layer of such a degree that will be produced by migration of the copper and transparent metal oxide layers are best suited for maximizing adhesion. Along with improvement of adhesion, other important characteristics can also be improved by this means.

(1) For example, usually Ni plating or anti-corrosive coating is applied on the copper surface for the purpose of preventing oxidation, but it is possible to prevent penetration of water vapor or gases such as oxygen via the base and oxidative deterioration of adhesion with time by providing a transparent oxide layer with high gas barrier properties. This is of great importance for obtaining long-lasting reliability.

(2) In case a conductor is used as the transparent metal oxide, conductivity is provided to also the mesh openings formed by copper lamination, resulting in the improved electromagnetic wave shielding effect. In case arrangement is made such that frequency dependency of shield performance will differ between the mesh-formed electromagnetic wave shielding layer and the ITO layer, it is possible to widen the range of frequency of electromagnetic waves that can be shielded, which greatly enhances the electromagnetic wave shield performance.

(3) The ITO film has the property to shield light in the near infrared region, so that an effect of affording a near infrared screening function to the transparent electromagnetic wave shield is obtained.

(4) It is possible to provide an anti-reflection function due to the difference in refractive exponential between the ITO film and the coating layer laminated thereon.

The copper layer thickness is preferably in the range of 50 Å to 50 $\mu$m. When this layer thickness is less than 50 Å, the shielding effect is unsatisfactory, and when the thickness exceeds 50 $\mu$m, pattern workability is deteriorated and/or light permeability of the layer decreases. Besides sputtering and vapour deposition, electroplating can also be employed for forming the copper layer. A proper method is selected in consideration of economy, pattern workability and shielding performance. Plating such as gold or nickel plating or anti-corrosive coating may be applied as desired on the copper layer surface for the purpose of preventing oxidative degradation.

In pattern working with copper, it is necessary to selectively etch the copper layer alone. This is important for providing satisfactory adhesion of the copper layer, optical properties of the transparent electromagnetic wave shield and its shielding performance. The pattern working conditions can be set according to the type of the transparent metal oxide film. For instance, in case the oxide film is made of $SiO_x$, $TiO_x$ or a composite thereof, an ordinary copper etching solution such as a solution of cupric chloride, ferric chloride or the like is used. In the case of a transparent conductive film with high crystallinity, it is possible to selectively etch the copper layer alone by using a selective etching solution such as ferric nitrate.

PDP is made luminous by utilizing xenon gas discharge. Since the near infrared rays generated in this operation may leak to the outside to cause erroneous operation of the widely used sensors, the near infrared ray screening function is essential for the front shield of PDP. The near infrared region that needs to be shielded here is preferably from 800 to 1,100 nm, more preferably from 800 to 1,500 nm. It is necessary to keep sufficient light permeability in the visible light region of 400 to 800 nm. However, many of the substances which have the shielding function in this near infrared region, also show a light absorbing tendency in the visible light region, giving rise to the problem that an object which is actually transparent, looks like tinted. The present inventors found that this tinting problem can be solved by making color compensation by adding a colorant.

The colorant to be added may be a dye, pigment or other substances showing absorption in the visible light region. Several different colorants may be added. A proper colorant is selected in view of the type of the near infrared absorber used, compatibility with the binder resin layer, and solubility in solvents. For example, the synthetic dyes usable as a colorant in this invention include oil-soluble dyes, organic solvent-soluble dyes such as metal complex salt type, dispersed dyes, basic dyes, acid dyes such as metal complex salt dyes, reactive dyes, direct dyes, sulfide dyes, vat dyes, azoic dyes, mordant dyes, and composite dyes. The inorganic pigments usable as said colorant include mica-like iron oxide, basic lead carbonate, red lead, chrome yellow, red mercuric oxide, ultramarine blue, Prussian blue, cobalt oxide, strontium chromate, zinc chromate, titanium dioxide, titanium yellow, titanium black, black iron oxide, molybdenum-based pigments, litharge, and lithopon. The organic pigments include azo pigments, phthalocyanine blue and the like.

The tint yielded by color compensation is preferably as close to colorless as possible, but it may be optionally selected by taking into account recognizability, texture and other factors according to the purpose of use of the transparent electromagnetic wave shield. It is possible to add several types of near infrared screening materials differing in screening wavelength region for providing the desired near infrared screening performance.

For providing the near infrared screening function, there are employed a method in which such function is afforded to the transparent polymer reinforcement and a method in which a coating layer is additionally provided. However, the former method is subjected to restrictions relating to the base producing conditions, such as heat resistance and solubility of the near infrared screening material, while the latter method necessitates incorporation of an extra step to raise the cost problem. These problems can be overcome by providing the near infrared screening function to the adhesive layer.

The adhesive can be selected from a wide variety of materials, which allows easy material designing in relation to the properties of the near infrared screening material.

Also, there is no need of additionally laminating a coating layer for providing said function to the adhesive which is indispensable for maintaining close adhesion between the base and the conductive layer. As for the amount of the near infrared screening material, said function can usually be afforded by adding the screening material in an amount of less than 1 wt % based on resin solid content of the adhesive layer, though the amount depends on the thickness of the adhesive layer, so that the adhesive layer remains substantially unchanged in its properties with addition of the near infrared screening material.

In case a near infrared screening material and a colorant are added as described above, if there are differences between them in compatibility with resin, dispersibility, good solvent, etc., it is unfavorable to add them to a same coating layer. In such a case, it is possible to enhance the function of the transparent electromagnetic wave shield if a desired degree of freedom of selection for the materials to be added and the resin layer is provided. This can be realized by adding a near infrared screening material and a colorant for making color compensation for said screening material separately to the adhesive layer 1 (provided between the conductive layer and the film) and the adhesive layer 2 (provided for bonding the laminated film having a patterned conductive layer to the transparent polymer reinforcement) respectively, or to the adhesive layer 1 or 2 alone.

The adhesive layer is required to have sufficient adhesive strength to the adherend, but it is very difficult to design a formulation that involves addition of several types of materials differing in solubility characteristics and resin compatibility. However, selection of the near infrared screening material and the colorant for color compensation is greatly facilitated by adding said materials severally to the different resin layers. Regarding the adhesive layer 1 in particular, it is highly probable that the layer surface be exposed to an acid or alkaline aqueous solution in the heating step for lamination of the conductive layer or in pattern working, so that the material which can be greatly deteriorated in properties on such occasions is preferably added to the adhesive layer 2.

In case both of the near infrared screening material and the color compensation material are not sufficiently dissolved in the adhesive layer 1 alone, the two adhesive layers 1 and 2 are designed so that they will be compatible with the respective materials. There are certain additives having low solubility in resin, and use of such additives presents the problem that the film thickness must be increased greatly when it is tried to obtain the desired effect with one layer alone. Such problem, however, can be overcome by adding the additives severally to the two layers.

It has been found, however, that the near infrared screening material and the colorant added in the manner described above have the problem in weather resistance and are also subjected to change in absorption characteristics with time, presenting the problem in long-term reliability. Particularly the near infrared screening materials showing absorption characteristics in the ultraviolet region had such inclination and were unable to maintain their normal function over a long time. According to the present invention, such color deterioration of the near infrared screening materials can be prevented by providing at least one layer in which a material having an ultraviolet screening function has been added.

It is possible to use the conventional ultraviolet screening materials as far as they have the effect of screening light in the ultraviolet region. Typical examples of such screening materials are organic ultraviolet absorbers including salicylate type, benzophenone type, benzotriazole type, cynoacrylate type and nickel chelate type, fine particles of inorganic materials such as titanium oxide, zinc oxide and iron oxide, and light stabilizers such as hindered amine type (HALS). These ultraviolet screening materials may be used either singly or in combination. The layer in which such an ultraviolet screening material is added, may be any of the layers provided on the transparent electromagnetic wave shield.

It has been also confirmed that the change of absorption characteristics of the near infrared screening material and the colorant could be strikingly promoted in the presence of water. This is because water acts as a catalyst. This problem can be solved by protecting the screening material and colorant with a water vapor barrier. It is possible to provide a single layer or plural layers of water vapor barrier. Alternatively, the adhesive layer in which the near infrared screening material is contained may be per se provided with such barrier properties.

The material used for forming the water vapor barrier is not specified; it is possible to use, for instance, organic materials such as polyvinyl alcohol, ethylene-vinyl alcohol copolymer, polyacrylonitrile, polyvinylidene chloride, etc., and inorganic materials, e.g., transparent metal oxides such as silica, alumina, titania, ITO, etc. A suitable material is selected in consideration of cost, productivity, required barrier performance and other factors. The barrier film forming method is decided depending on the material used; for instance, such a method as coating, vapour deposition, sputtering or ionic plating may be employed for forming the barrier film.

Since the frequency of the electromagnetic waves to be shielded is usually in the range of 10 KHz to 1,000 MHz, the conductive layer is required to have conductivity of not more than 103 Ω·cm in terms of resistivity.

Generally, the electromagnetic wave shielding effect is represented by the following equation:

$$S(\text{dB}) = 10 \log (1/\rho f) + 1.7 t \sqrt{f/\rho}$$

$S(\text{dB})$: electromagnetic wave shielding effect
$\rho(\Omega \cdot \text{cm})$: volume resistivity of conductive layer
$f(\text{MHz})$: electromagnetic wave frequency
$t(\text{cm})$: conductive layer thickness Naturally, resistivity $\rho$ must be lowered infinitely for maximizing the electromagnetic wave shielding effect S; the lower the resistivity is, the electromagnetic waves of a wider range of frequency can be shielded effectively. It is possible to properly design the pattern shape and the material and thickness of the conductive layer for obtaining the desired shielding effect.

The thus constructed electromagnetic wave shielding filter made it possible to drastically improve the shielding effect expressed by the following equation:

$$S(\text{dB}) = 20 \times \log 10(E0/E1)$$

$E0$: entering electromagnetic wave
$E1$: electromagnetic wave which passed

It has been considered as a standard that the allowable shielding effect of the conventional electromagnetic wave absorbers be at the level of 20 dB or above, which corresponds to an electromagnetic wave absorption rate of 99% or above, but according to the present invention it has become possible to raise the level of allowable shielding effect to 30–50 dB.

The transparent polymer reinforcing sheet can endure external pressure, but damage due to scratching or the like causes reduction of transparency, so that a protective hard coat may be provided as desired. Such a hard coat may be formed with thermosetting resins, for example, UV-curing resins such as epoxy acrylates and urethane acrylates, and epoxy resins. Inorganic materials, specifically transparent oxides such as silicon oxide, alumina, titanium oxide and zirconium oxide are also preferably used. Further, since a polymer is used for the normal reinforcing sheets for weight reduction, such sheets are required to have a strength which is normally supposed to be provided by a thickness of 1 mm or greater. A greater thickness provides a higher strength, but it is disadvantageous in terms of weight and transparency, so usually a thickness of 1 mm or above (up to 5 mm) suffices for the purpose to provide a strength capable of enduring artificial external force and finger pressure in practical use.

It is further desirable that the transparent polymer reinforcing sheet has an antireflection function. This function is required for preventing irregular reflection at the display surface from PDP to enhance the contrast. Of course, antireflection property may be provided to the hard coat, or a separate antireflection layer may be formed.

DESCRIPTION OF PREFERRED EMBODIMENTS

EXAMPLE 1

A polyurethane adhesive layer 1 was coated on a 75 μm thick polyethylene terephthalate (hereinafter abbreviated as PET) film, and then a copper foil (12 μm thick) was laminated thereon to obtain a copper-foiled PET film. The conductive layer was patterned into a lattice form consisting of the straight lines arranged longitudinally and laterally by photolithography. The line intervals of the pattern were defined by the following equation (6). The line width was 10 μm.

$$Pi=100+(170-100)\times \alpha i \qquad (6)$$

(αi: random number between 0 and 1)

Then, on one side of a 2 mm thick polycarbonate substrate was applied a hard coat having an antireflection function and a pencil hardness of 3H or above, and the pattern-worked base film was laminated to the uncoated side of the polycarbonate substrate with an adhesive layer 2 of an aliphatic polyester-urethane (AD-N401 produced by TOYO-MORTON Co. Ltd.). A flat cable was bonded to the conductive layer at an outer edge with a silver paste (CRM-1085 produced by Sumitomo Bakelite Co., Ltd.) and electrically grounded. Light permeability at 550 nm of the obtained laminated film as a transparent electromagnetic wave shield was 74%, its light permeability in the near infrared region was <10% (at 900–1,200 nm), and its electrical field shielding performance was 50 dB or above (as measured by ADVANTEST method) in the frequency region of 200–1,000 MHz. When the transparent electromagnetic wave shield was set on a PDP screen, no moire fringe was formed and recognizability of the picture was excellent. Having pencil hardness of 3H or above and excellent scratch resistance, the product showed not only excellent shielding performance but also high durability as a transparent electromagnetic wave shield for PDP.

COMPARATIVE EXAMPLE 1

In Example 1, the whole of lattice mesh formed by pattern working was designed to have a line interval of 160 μm and a line width of 10 μm. When the transparent electromagnetic wave shield was set on the front side of PDP, the moire fringes appeared and the shield was unsuited for practical use.

EXAMPLES 2 AND 3

Figure 1:
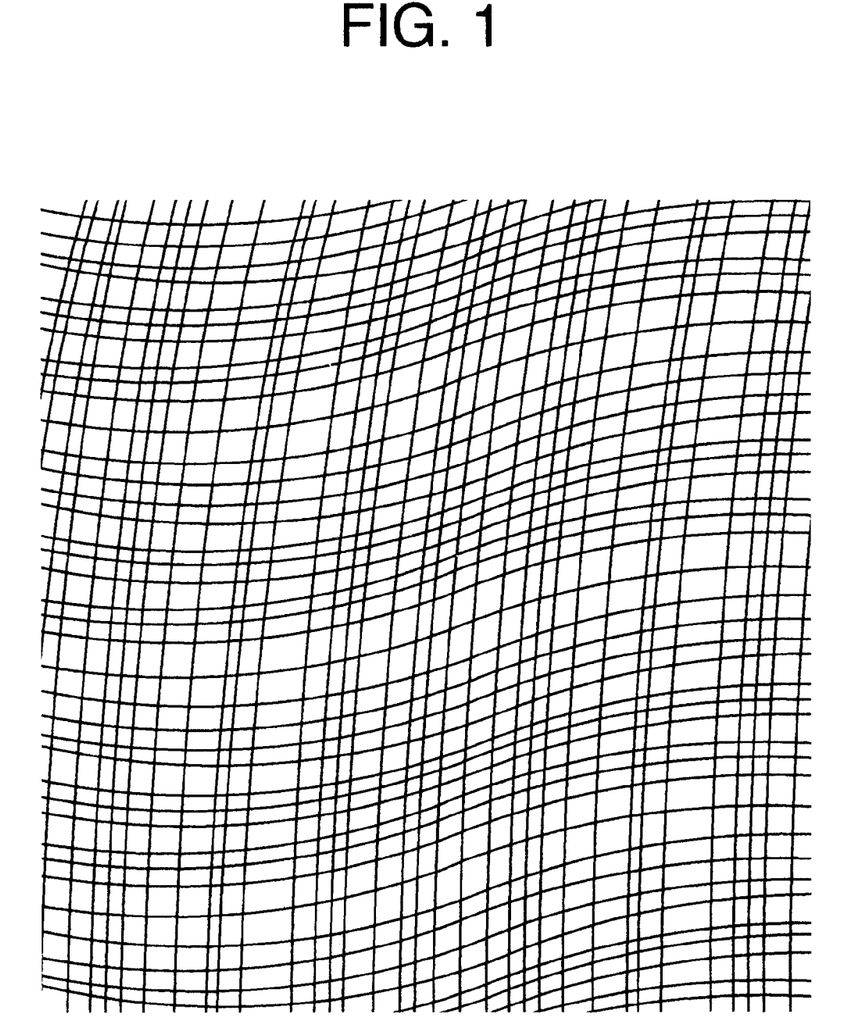
FIG. 1 is a schematic illustration of the pattern in Example 2.

A polyurethane adhesive layer 1 was coated on a 75 μm thick PET film, and then a copper foil (12 μm thick) was laminated thereon to obtain a copper-foiled PET film. The conductive layer was patterned by photolithography to form a pattern comprising longitudinal and lateral array of curves expressed by Sin and Tan functions. The line width of the pattern was 10 μm. The pitch of the lines was set according to the above-shown equation (6) (Example 2) and the following equation (7) (Example 3).

$$Pi=100+(170-150)\times \alpha i \qquad (7)$$

(αi: random number between 0 and 1)

Then, on one side of a 2 mm thick polycarbonate substrate was applied an antireflection hard coat with a pencil hardness of 3H or above, and the pattern-worked base film was laminated on the uncoated side of the polycarbonate substrate with an adhesive layer 2 of an aliphatic polyester-urethane (AD-N401 produced by TOYO-MORTON Co., Ltd.). A flat cable was bonded to the conductive layer at an outer edge with a silver paste (CRM-1085 produced by Sumitomo Bakelite Co., Ltd.) and electrically grounded. Having a pencil hardness of 3H or above and excellent scratch resistance, the product showed not only excellent shielding performance but also high durability as a transparent electromagnetic wave shield for PDP.

In Example 2, light permeability of the shield at 550 nm was 74%, its light permeability in the near infrared region was <10% (at 900–1,200 nm) and its electrical field shielding performance was 50 dB or above (as measured by ADVANTEST method) in the frequency range of 200–1,000 MHz.

In Example 3, light permeability of the shield at 550 nm was 78%, its light permeability in the near infrared region was <10% (at 900–1,200 nm) and its electrical field shielding performance was 48 dB or above (as measured by ADVANTEST method) in the frequency range of 200–1,000 MHz.

When the transparent electromagnetic wave shield was set on a PDP screen, no moire fringe was formed and good picture recognizability was obtained in both Examples 2 and 3.

EXAMPLES 4–6

Figure 2:
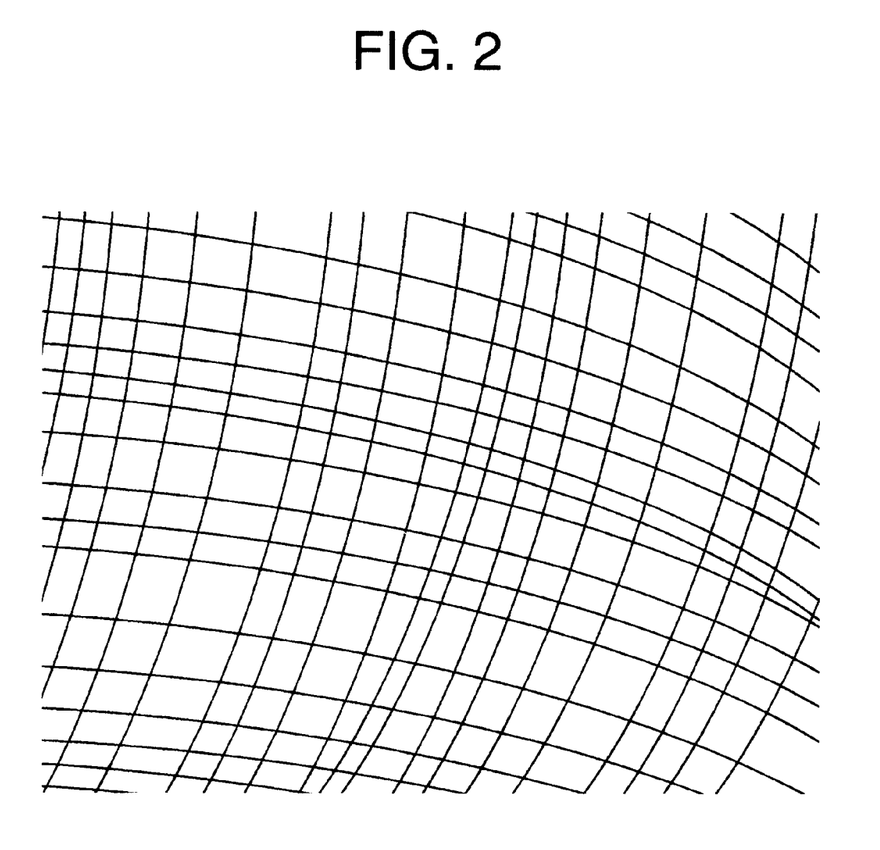
FIG. 2 is a schematic illustration of the pattern in Example 4.
Figure 3:
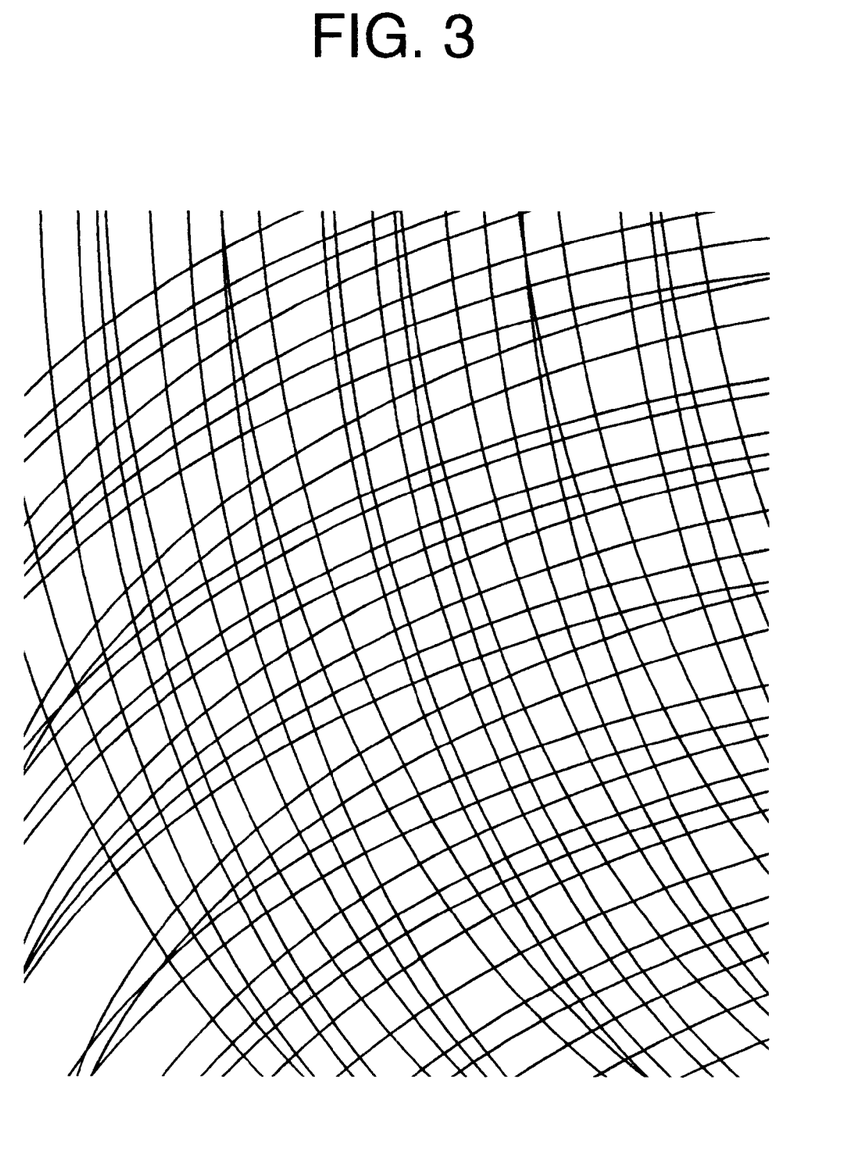
FIG. 3 is a schematic illustration of the pattern in Example 5.
Figure 4:
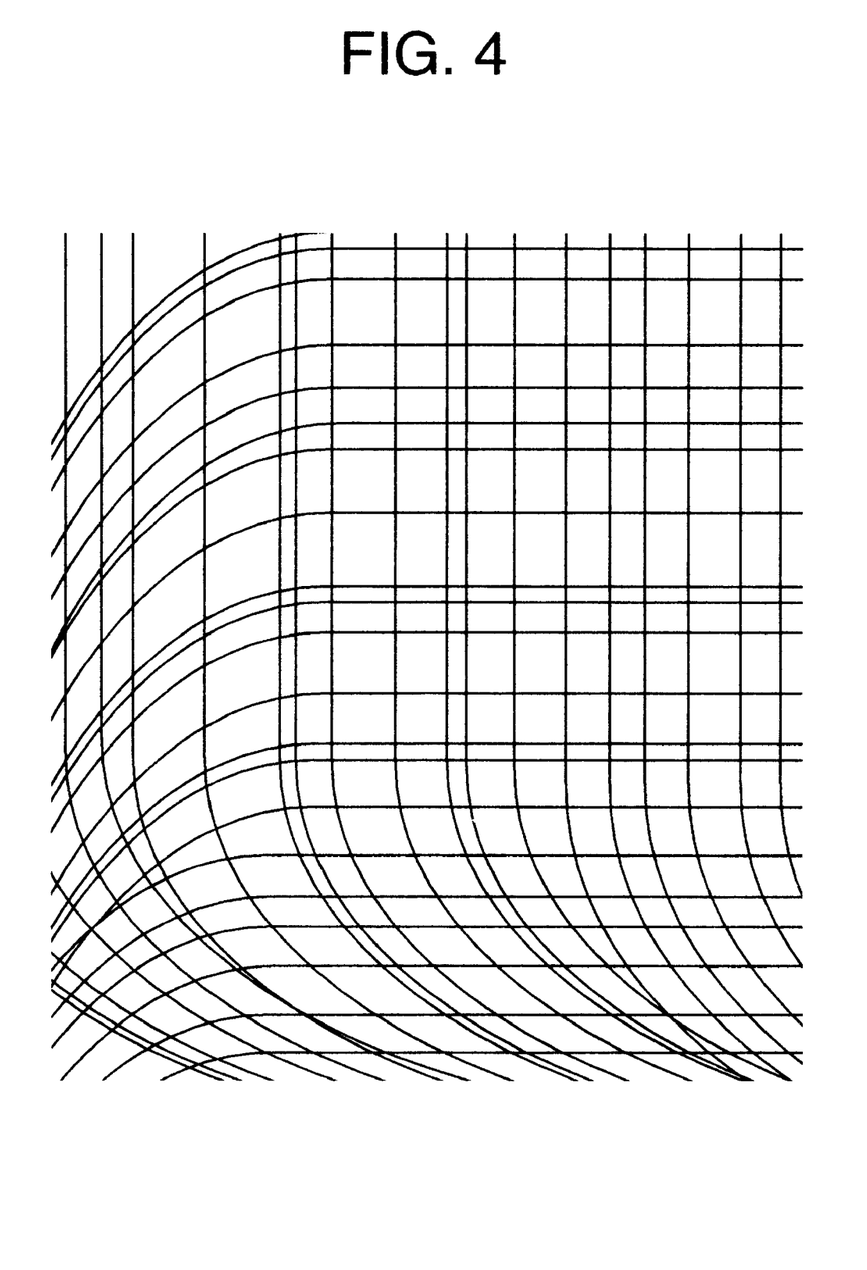
FIG. 4 is a schematic illustration of the pattern in Example 6.

In Example 1, the pattern was formed with the curves expressed by an exponential function (Example 4), a logarithmic function (Example 5) and an inversely proportional function (Example 6). There were obtained the transparent electromagnetic wave shields which, when superposed on a PDP screen, caused no formation of moire fringe and provided excellent recognizability.

COMPARATIVE EXAMPLE 2

In Example 1, the copper layer thickness was changed to 35 μm, the line width of the mesh filter pattern to 30 μm and the space width to 300 μm. The shielding effect of the obtained shield in the frequency range of 200–1,000 MHz was 40 dB, and light permeability at 550 nm was 30%.

EXAMPLE 7

A 75 μm thick PET film was undercoated to a thickness of 1 μm with a coating material comprising 100 parts by weight of an epoxy acrylate prepolymer (VR-60 produced by Showa Kobunshi KK) having a molecular weight of 1,540 and a melting point of 70° C., 400 parts by weight of butyl acetate, 100 parts by weight of cellosolve acetate and 2 parts by weight of benzoin ethyl ether. Then indium oxide was sputtered thereon to form a crystalline film having a permeability of 80% and a sheet resistance of 150 Ω. On this film was further formed a 2,000 Å thick copper film by sputtering, followed by electroplating to obtain a copper-foiled PET film having a copper thickness of 4 μm and a surface resistance of $4\times10^{-3}$ Ω/□. Patterning was conducted on the conductive layer by photolithography using ferric nitrate as etching solution to obtain a filter pattern of the configuration described in Example 1.

The copper foil sides of the obtained films were bonded to each other with a thermo-setting epoxy adhesive and subjected to a 90° peel test, which showed adhesion force of 1 kg/cm or more. In an accelerated test conducted under a high temperature and high humidity (80° C. and 90% RH) condition, adhesion force after 1,000 hours was 900 g/cm, a level quite acceptable for practical use.

Also, light permeability at 550 nm of the laminated film as a transparent electromagnetic wave shield was 70%, its light permeability in the near infrared region was <10% (at 900–1,200 nm) and its electrical field shielding performance was 50 dB or above (as measured by ADVANTEST method) in the frequency range of 200–1,000 MHz.

EXAMPLE 8

A transparent electromagnetic wave shield was manufactured in the same way as in Example 7 except that the transparent metal oxide film was made of SiOx. The adhesion test conducted on the shield similarly to Example 7 showed adhesive strength of 1 kg/cm or more.

Also, light permeability of the shield at 550 nm was 72%, its light permeability in the near infrared region was <10% (at 900–1,200 nm) and its electrical field shielding performance was 50 dB or above (as measured by ADVANTEST method) in the frequency range of 200–1,000 MHz.

COMPARATIVE EXAMPLE 3

In Example 7, instead of forming a transparent metal oxide film, copper was laminated by electroplating. In the adhesion test conducted in the same way as in Example 7, the adhesive strength was less than 200 g/cm and the lines were partly damaged in the patterning step, resulting in a very bad yield.

EXAMPLE 9

On a 75 μm thick PET film was coated a polyurethane adhesive layer 1 containing a diimonium-based near infrared screening material (IRG-022 produced by Nippon Kayaku KK) and a colorant (KAYASET Blue A-2R produced by Nippon Kayaku KK) for color compensation, and a copper foil (12 μm thick) subjected to roughening treatment on both sides was laminated to obtain a copper-foiled PET film. The conductive layer was patterned by photolithography to obtain a filter pattern of the same configuration as that of Example 1. On one side of a 2 mm thick polycarbonate substrate was formed an antireflection hard coat with a pencil hardness of 3H or more, and the pattern-worked base film was laminated to the uncoated side of the polycarbonate substrate with an adhesive layer 2 of an aliphatic polyester-urethane (AD-N401 produced by TOYO-MORTON Co., Ltd.). A flat cable was bonded to the conductive layer at an outer edge with a silver paste (CRM-1085 produced by Sumitomo Bakelite Co., Ltd.) and electrically earthed. Light permeability at 550 nm of this product as a transparent electromagnetic wave shield was 74%, its light permeability in the near infrared region was <10% (at 900–1,200 nm) and its electrical field shielding performance was 50 dB or more (measured by ADVANTEST method) in the frequency range of 200–1,000 MHz. Having a pencil hardness of 3H on the hardcoated side and excellent scratch resistance, the obtained laminated film showed not only excellent shielding effect but also high durability as a transparent electromagnetic wave shield for PDP.

EXAMPLE 10

A polyurethane adhesive layer 1 was coated on a 75 μm thick PET film, and then a copper foil (12 μm thick) subjected to roughening treatment on both sides was laminated to obtain a copper-foiled PET film. The conductive layer on this film was patterned by photolithography to obtain a filter pattern of the same configuration as that of Example 1.

On one side of a 2 mm thick polycarbonate substrate was applied an antireflection hard coat having a pencil hardness of 3H or more, and the pattern-worked base film was laminated on the uncoated side of the polycarbonate substrate with an adhesive layer 2 of an aliphatic polyester-urethane (AD-N401 produced by TOYO-MORTON Co., Ltd.) containing an aluminum-based near infrared screening material (KAYASORB IRG-022 produced by Nippon Kayaku KK) and a colorant (KAYASET Blue A-2R produced by Nippon Kayaku KK) for color compensation. Also, a flat cable was bonded to the conductive layer at an outer edge with a silver paste (CRM-1085 produced by Sumitomo Bakelite Co., Ltd.) and electrically grounded.

Light permeability at 550 nm of the product as a transparent electromagnetic wave shield was 74%, its light permeability in the near infrared region was <10% (at 9001–1,200 nm) and its electrical field shielding performance was 50 dB or more (measured by ADVANTEST method) in the frequency range of 200–1,000 MHz. Having a pencil hardness of 3H on the hard coated side and excellent scratch resistance, the product showed not only excellent shielding effect but also high duralibity as a transparent electromagnetic wave shield for PDP.

EXAMPLE 11

In Example 9, the diimonium-based near infrared screening material (KAYASORB IRG-002 produced by Nippon Kayaku KK) was contained in the adhesive layer 1, while the colorant for color compensation of said material was contained in the adhesive layer 2, and the pattern-worked film was bonded to the reinforcing substrate. There was obtained a non-tinted transparent electromagnetic wave shield having light permeability of 10% or less in the near infrared region of 900–1,200 nm and 68% at 550 nm.

COMPARATIVE EXAMPLE 4

In Example 11, the laminated film which had been pattern-worked was bonded to the reinforcing substrate without adding a color compensating colorant to the adhesive layer 2. The product showed light permeability of 10% or less in the near infrared region of 900–1,200 nm and 68% at 550 nm, but it bore a greenish tint attributable to the near infrared screening material and was unsuited for use as a transparent electromagnetic wave shield for PDP.

EXAMPLE 12

On one side of a 75 μm thick PET film was coated a polyurethane adhesive layer 1 containing a near infrared screening material (KAYASORB IRG-022 produced by Nippon Kayaku KK), and then a copper foil (12 μm thick) subjected to roughening treatment on both sides was laminated to obtain a copper-foiled PET film. The conductive layer on the film was patterned by photolithography to obtain a filter pattern of the configuration described in Example 1.

On a 2 mm thick polycarbonate substrate was provided, as a UV cutoff layer, an epoxy acrylate resin layer containing a benzotriazole-based ultraviolet absorber and a hindered amine-based light stabilizer, and on this layer was provided an antireflection hard coat having a pencil hardness of 3H or more. On the uncoated side of the substrate was laminated the pattern-worked base film with an aliphatic polyester-urethane (TOYO-MORTON Co., Ltd. AD-N401) adhesive layer 2 containing a colorant (Nippon Kayaku KAYASET Blue A-2R) for color compensation. Also, a flat cable was bonded to the conductive film at an outer edge with a silver paste (Sumitomo Bakelite CRM-1085) and electrically earthed.

Light permeability at 550 nm of the product as a transparent electromagnetic wave shield was 74%, its light permeability in the near infrared region was <10% (at 900–1,200 nm) and its electrical field shielding performance was 50 dB or more (measured by ADVANTEST method) in the frequency range of 200–1,000 MHz. Having a pencil hardness of 3H and excellent scratch resistance, the product showed not only excellent shielding effect but also high durability as a transparent electromagnetic wave shield for PDP. In a 1,000-hour weathering test, deterioration of the near infrared screening performance was 3% or less and there was observed no change of tint due to deterioration of color compensation effect.

EXAMPLE 13

In Example 12, a silica film was provided as a water vapor barrier on the non-copper-laminated side of the PET film, and between the UV screening layer and the antireflection layer. In a 1,000-hour wet heat test (at 80° C. and 90% RH), deterioration of the near infrared screening performance was 3% or less and no change of tint due to deterioration of color compensation effect was observed.

COMPARATIVE EXAMPLE 5

In Example 12, a transparent electromagnetic wave shield was made without providing a UV screening layer. In a 1,000-hour weathering test, light permeability of the shield at 550 nm was 70% and its light permeability in the near infrared region was <40% (at 900–1,200 nm), which indicates marked deterioration of the near infrared screening performance.

COMPARATIVE EXAMPLE 6

In Example 13, a transparent electromagnetic wave shield was made without providing the water vapor barrier. In a 1,000-hour wet heat test (at 80° C. and 90% RH), light permeability of the shield at 550 nm was 71% and its light permeability in the near infrared region was <38% (at 900–1,200 nm), indicating marked deterioration of the near infrared screening performance.

EXAMPLE 14

In Example 1, a 2,000 Å thick copper film was formed by sputtering as the conductive layer, and this layer was electroplated to form copper thickness of 4 μm. Light permeability of the produced transparent electromagnetic wave shield at 550 nm was 74%, its light permeability in the near infrared region was <10% (at 900–1,200 nm) and its electrical field shielding performance was 45 dB or more (measured by ADVANTEST method) in the frequency range of 200–1,000 MHz.

As apparent from the foregoing Examples, the present invention has made it possible to provide a transparent electromagnetic wave shield with very excellent transparency.

What is claimed is:

1. A transparent electromagnetic wave shield comprising a transparent polymer film and a conductive layer of a linear pattern shape formed on at least one side of said film, wherein the line intervals in said linear pattern are random between 20 μm and 1 mm.

2. A transparent electromagnetic wave shield according to claim 1, wherein the linear pattern is of a lattice form consisting of the straight lines arranged longitudinally and laterally.

3. A transparent electromagnetic wave shield according to claim 1, wherein the linear pattern is of a configuration constituted by longitudinal and lateral arrangement of the curves conforming to the Sin or Tan function expressed by the following equation (1) or (2):

$$y = A \cdot \mathrm{Sin}\,(\alpha x + \phi) \tag{1}$$

$$y = B \cdot \mathrm{Tan}\,(\beta x + \psi) \tag{2}$$

(A, B, α, β, φ, ψ): arbitrary constants).

4. A transparent electromagnetic wave shield according to claim 1, wherein the linear pattern is of a configuration constituted by longitudinal and lateral arrangement of the curves conforming to the exponential or logarithmic function expressed by the following equation (3) or (4):

$$y = C \cdot \exp\,(\gamma x + \rho) \tag{3}$$

$$y = D \cdot \ln\,(\delta x + \xi) \tag{4}$$

(C, D, γ, δ, ρ, ξ: arbitrary constants).

5. A transparent electromagnetic wave shield according to claim 1, wherein the linear pattern is of a configuration constituted by longitudinal and lateral arrangement of the curves conforming to the inversely proportional function expressed by the following equation (5):

$$y = E/x \tag{5}$$

(E: arbitrary constant).

6. A transparent electromagnetic wave shield according to claim 1, wherein the linear pattern is of a configuration constituted by a combination of arrangements of the straight lines and curves defined in claims 2 to 5.

7. A transparent electromagnetic wave shield according to claim 1, wherein the ratio of the line width (P, μm) to the conductive layer thickness (D, μm) in the linear pattern (P/D ratio) falls within the range of 1 to 540.

8. A transparent electromagnetic wave shield according to claim 7, wherein the P/D ratio is 2 to 240.

9. A transparent electromagnetic wave shield obtained by laminating an adhesive layer optionally, a transparent metal oxide film and a thin metal layer successively in that order on at least one side of a transparent polymer film, and selectively etching the thin metal layer alone to form a linear pattern, wherein the line intervals in said linear pattern are random between 20 μm and 1 mm.

10. A transparent electromagnetic wave shield according to claim 9, wherein the thin metal layer is made of copper.

11. A transparent electromagnetic wave shield obtained by laminating an adhesive layer containing a near infrared screening material and a colorant for making color compensation and a conductive layer successively on at least one side of a transparent polymer film, and working the conductive layer of the laminated film into a linear pattern, wherein the line intervals in said linear pattern are random between 20 µm and 1 mm.

12. A transparent electromagnetic wave shield comprising a transparent polymer film and, laminated successively on at least one side thereof, an adhesive layer 1 and a conductive layer, said conductive layer being worked into a linear pattern designed such that the line intervals will be random between 20 µm and 1 mm, the thus worked laminated film being further bonded to a transparent polymeric reinforcement by an adhesive layer 2, wherein a near infrared screening material and a colorant for making color compensation for said near infrared screening material are contained in at least one of the adhesive layer 1 and the adhesive layer 2, and also at least one ultraviolet screening layer for preventing deterioration of said near infrared screening material is provided.

13. A transparent electromagnetic wave shield according to claim 11, wherein at least one layer of water vapor barrier is further provided.

14. A transparent electromagnetic wave shield comprising a transparent polymer film and, laminated successively on at least one side thereof, an adhesive layer 1 and a conductive layer, said conductive layer being worked into a linear pattern designed such that the line intervals will be random between 20 µm and 1 mm, the thus worked laminated film being further bonded to a transparent polymeric reinforcement by an adhesive layer 2, wherein a near infrared screening material and a colorant for making color compensation for said near infrared screening material are contained separately in the adhesive layer 1 and the adhesive layer 2, or contained in the adhesive layer 2 alone.

15. A transparent electromagnetic wave shield according to claim 1, wherein light permeability of the shield at a wavelength of 550 nm is 50% or higher.

16. A transparent electromagnetic wave shield according to claim 1, wherein the laminated film is laminated to a transparent polymeric reinforcement having a thickness of 1 mm or greater via an adhesive layer.

17. A transparent electromagnetic wave shield according to claim 1, wherein an anti-reflection layer is provided on at least one of the laminated film and the transparent polymeric reinforcement.

18. A transparent electromagnetic wave shield according to claim 1, wherein a hard coat is provided on at least one of the laminated film and the transparent polymeric reinforcement.

\* \* \* \* \*